(12) United States Patent
Chen

(10) Patent No.: US 6,384,320 B1
(45) Date of Patent: May 7, 2002

(54) SOLAR COMPOUND CONCENTRATOR OF ELECTRIC POWER GENERATION SYSTEM FOR RESIDENTIAL HOMES

(76) Inventor: Leon Lung-Chen Chen, 126-03 7th Ave., College Point, NY (US) 11356

( * ) Notice: Subject to any disclaimer, the term of this patent is extended or adjusted under 35 U.S.C. 154(b) by 0 days.

(21) Appl. No.: 09/687,960

(22) Filed: Oct. 13, 2000

(51) Int. Cl.[7] .................. H01L 31/052; F24J 2/08; F24J 2/12
(52) U.S. Cl. .............. 136/259; 136/246; 126/683; 126/643; 359/742; 359/727; 60/641.15
(58) Field of Search ................ 136/246, 259; 126/683, 643; 359/742, 727; 60/641.15

(56) References Cited

U.S. PATENT DOCUMENTS

| | | | |
|---|---|---|---|
| 4,003,638 A | * 1/1977 | Winston | 136/246 |
| 4,114,592 A | * 9/1978 | Winston | 136/246 |
| 4,134,392 A | * 1/1979 | Livermore et al. | 136/246 |
| 4,238,246 A | * 12/1980 | Denequand et al. | 136/248 |
| 5,118,361 A | * 6/1992 | Fraas et al. | 136/246 |
| 5,505,789 A | 4/1996 | Fraas et al. | 136/246 |
| 5,915,376 A | 6/1999 | McLean | 126/653 |

OTHER PUBLICATIONS

Collares–Pereira et al, "High Temperature Solar Collector of Optimal Concentration—Non–Focusing Lens with Secondary Concentration," SUN Proceedings Int'l Solar Energy Society Congress, New Delhi, India, Jan. 1978, Pergamon Press 1978, pp. 1282–1286.*

* cited by examiner

Primary Examiner—Alan Diamond
(74) Attorney, Agent, or Firm—Collard & Roe, P.C.

(57) ABSTRACT

The invention relates to a solar compound concentrator of an electric power generation system. A compound parabolic concentrator (CPC) is mounted under an acrylic concentrating fresnel lens that concentrates the intensity of sunlight to five to ten times above normal level. Then the focused sunlight is further concentrated twenty to fifty times by the CPC collector. The intensified sunlight is focused on the bottom of the CPC. The high mirror quality of CPC allows 98% of the reflected rays to be incident on the bottom of the CPC. A cermet coating is spattered onto the top of a stainless steel heat pipe (heat exchanger) allowing for an absorptivity of 96%.

14 Claims, 3 Drawing Sheets

SOLAR COMPOUND CONCENTRATOR OF ELECTRIC POWER GENERATION SYSTEM FOR RESIDENTIAL HOMES

BACKGROUND OF THE INVENTION

1. Field of the Invention

This invention relates to a solar compound parabolic concentrator of an electric power generation system containing fresnel lenses with a CPC (compound parabolic concentrator) and a heat exchanger for use in residential homes.

2. The Prior Art

Solar concentrators having fresnel lenses have been shown in the prior art. For instance, U.S. Pat. No. 5,915,376 to McLean discloses a solar heat collecting apparatus. This invention comprises glass domes consisting of fresnel lenses. Solar radiation entering the solar heat collecting apparatus is absorbed by the absorber plate, and transferred to a remote storage system by conventional heat transfer means. A simple parabolic reflector may also be added.

U.S. Pat. No. 5,505,789 to Fraas et al discloses a line-focus photovoltaic module using solid optical secondaries for improved radiation resistance. This invention consists of an array of linear arched fresnel lenses with a linear photovoltaic cell receiver located along the focal line of each lens. The optical secondaries may be parabolic in shape.

These systems disclose the combination of fresnel lenses, parabolic reflectors, and a heat collecting apparatus. However, the present invention differs in that it combines the fresnel lens, compound parabolic reflector and heat pipe exchanger.

SUMMARY OF THE INVENTION

The invention relates to a solar compound concentrator of a thermal engine electric power generation system. A compound parabolic concentrator (CPC) is mounted under an acrylic concentrating fresnel lens that concentrates the intensity of sunlight to five to ten times above normal level. Then the focused sunlight is further concentrated twenty to fifty times by the CPC collector. The intensified sunlight is focused on the bottom of the CPC. The high mirror quality of CPC allows 98% of the reflected rays to be incident on the bottom of the CPC. A cermet coating is spattered onto the top of a stainless steel heat pipe (heat exchanger) allowing for an absorptivity of 96%.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF THE PREFERRED EMBODIMENT

Figure 1:
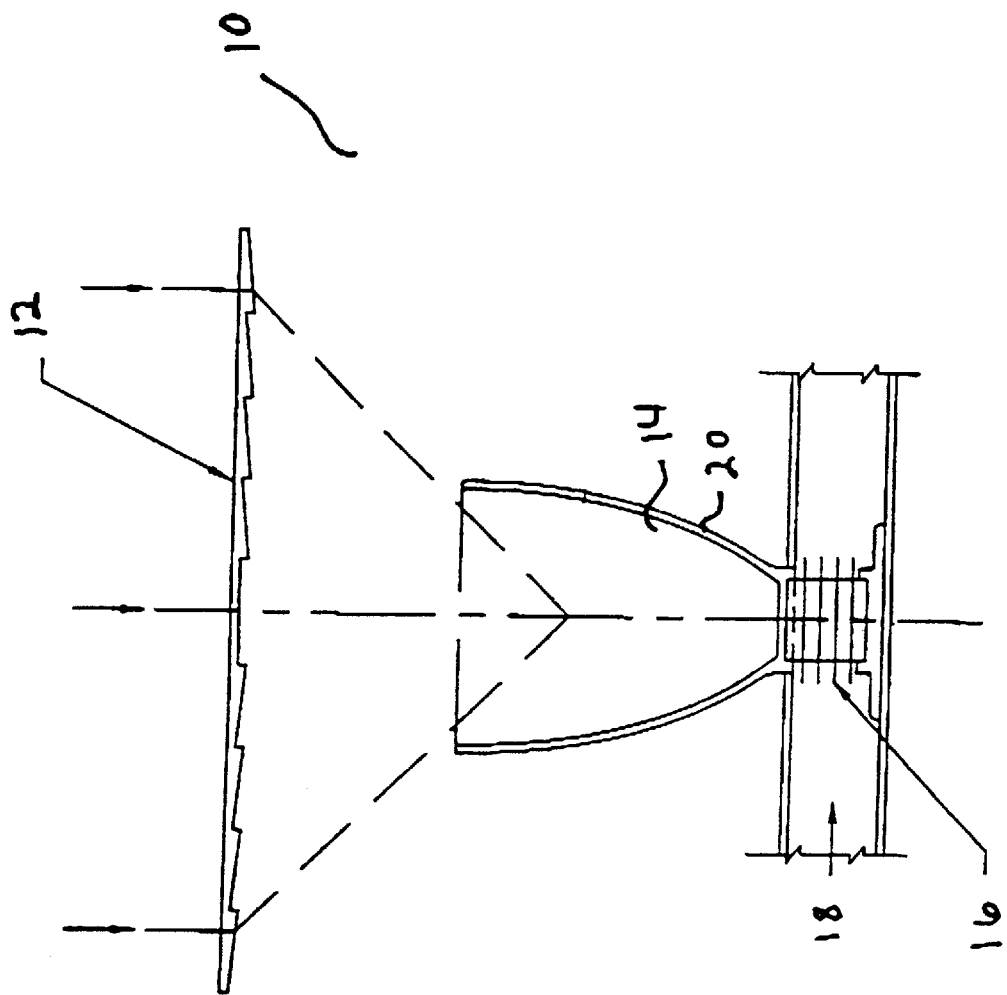
FIG. 1 shows a side perspective view of the collector system according to the invention.

Referring now in detail to the drawings and, in particular, FIG. 1 there is shown a collector structure 10 having fresnel lens 12 disposed above a compound parabolic concentrator (CPC) 14. Fresnel lens 12 concentrates the intensity of the sunlight 5 to 10 times above normal levels. The focused sunlight is further concentrated 20 to 50 times by CPC 14. This intensified sunlight is focused on the bottom of CPC 14 where a heat exchanger 16 is located. Fluid 18 flows through heat exchanger 16 and is heated by the concentrated solar energy produced and is increased in pressure.

CPC 14 is made of fiberglass containing a reflective surface coating and several layers of protective coating 20. The reflective surface coating can be aluminum foil, chrome coated metal plate covered with several layers of protective coatings. In a preferred embodiment, the coating of aluminum is 3 mils.

CPC 14 can be made of a ceramic material provided with a glass-mirror with silver-reflective coating covered with several layers of protective coating 20. The ceramic pad used to mount CPC 14 to the collector structure with a special adhesive. The protective coatings reduce heat loss and thermal stress at high operating temperatures.

Figure 4:
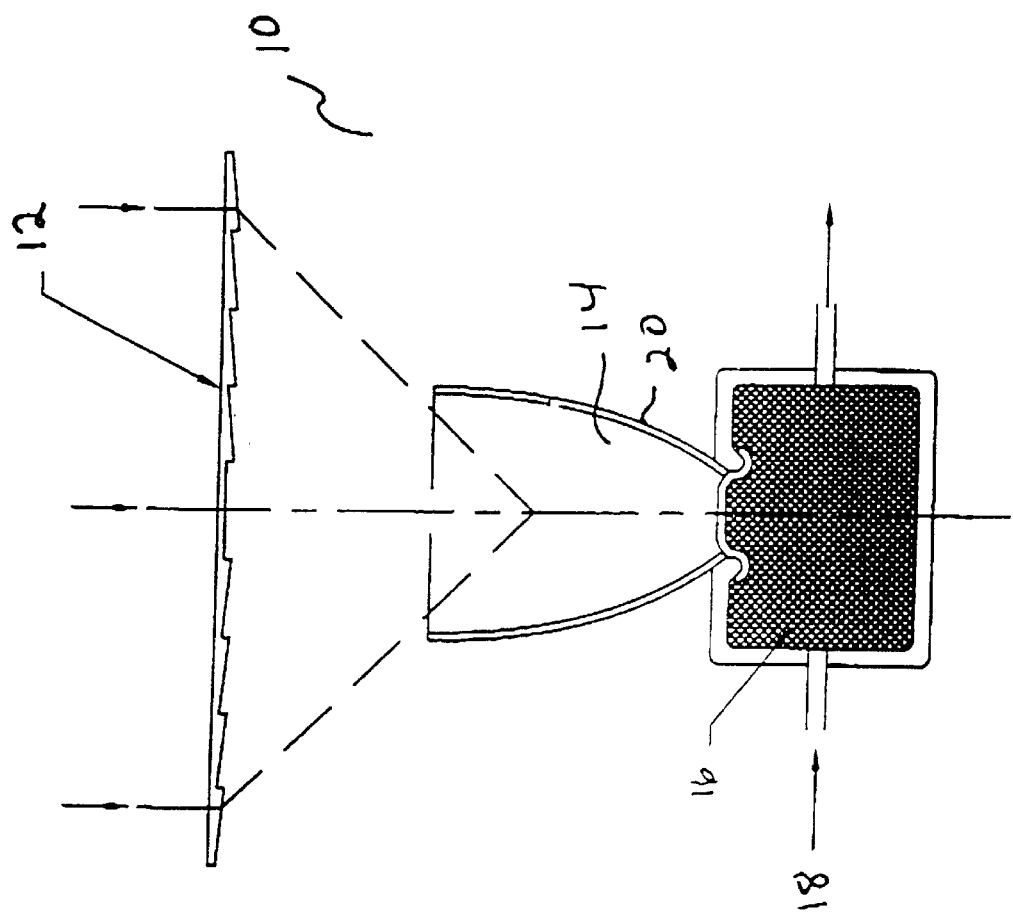
FIG. 4 shows another embodiment of the collector system.

Heat exchanger 16 is disposed next to the bottom of CPC 14 and may contain a cermet Coating, a mixture of ceramic and stainless steel. The cermet coating provides greater heat transfer properties with an absorptivity of 96% of the solar radiation. Heat exchanger 16 can also be designed as a honeycomb mesh-wired cross flow solar receiver, as shown in FIG. 4.

Figure 3:
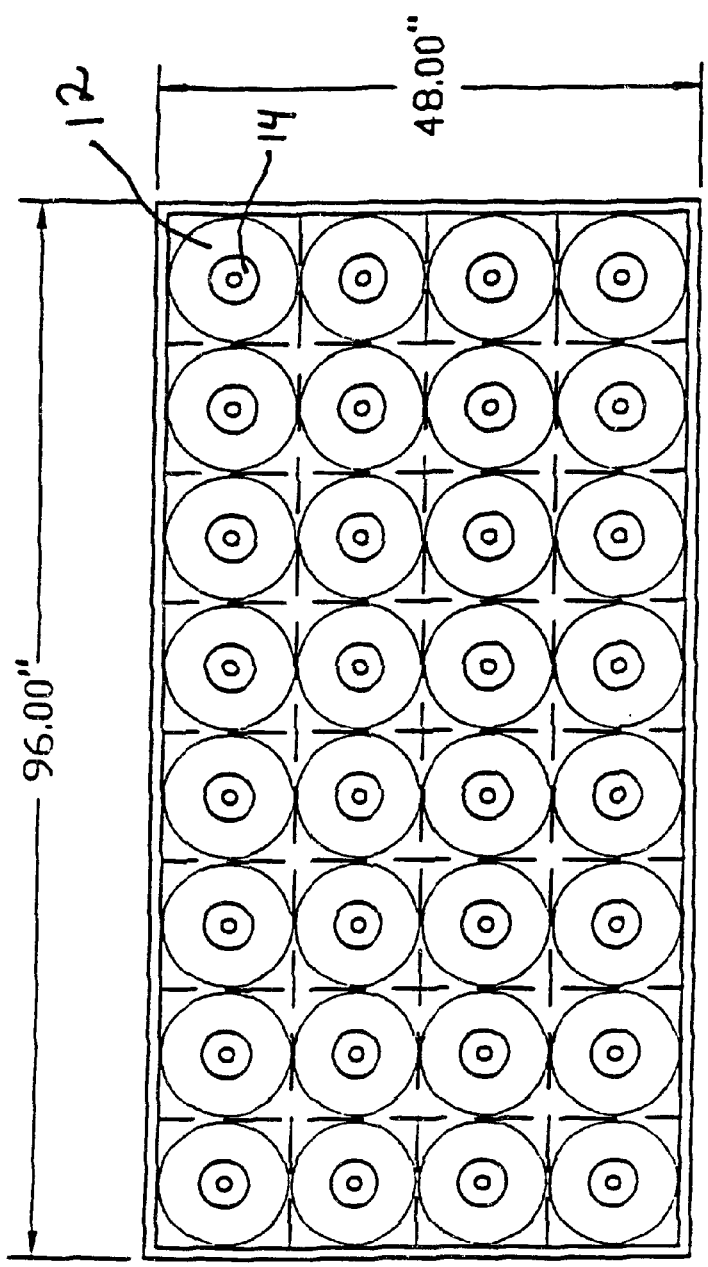
FIG. 3 shows a top view of FIG. 2.
Figure 2:
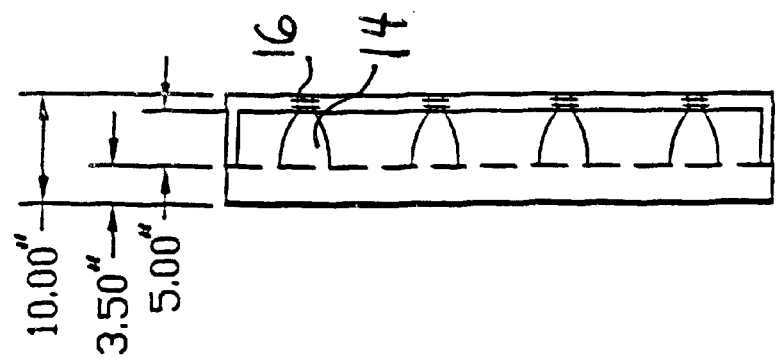
FIG. 2 shows a side view of multiple collectors according to the invention.

FIGS. 2 and 3 show a side view and a top view, respectively, of a solar concentrator system according to the invention. In this case, numerous concentrating devices are employed to collect and concentrate the sun rays. This system is designed to withstand winds of up to 70 mph.

In another embodiment of the invention a photovoltaic cell can replace heat exchanger 16. A gap between the bottom of CPC 14 and the photovoltaic cell is provided with cooling flow and a temperature sensor control to prevent overheating and burnout of the photovoltaic cell. This allows the system to operate at optimal performance of electric power generation.

Accordingly, while only a few embodiments of the present invention have been shown and described, it is obvious that many changes and modifications may be made thereunto without departing from the spirit and scope of the invention.

What is claimed is:

1. A solar thermal electric power generation system for residential home comprising:

a plurality of fresnel lenses for focusing sun rays such that the rays are concentrated five to ten times their normal intensity;

a plurality of compound parabolic concentrators having a bottom side and being under said plurality of fresnel lenses for further concentration of said focused sun rays twenty to fifty times; and a plurality of heat pipe heat exchangers for heating heat transfer fluid therein, wherein said plurality of heat pipes are disposed on said bottom side of said plurality of compound parabolic concentrators; and a housing that contains said plurality of fresnel lenses, compound parabolic concentrators, and heat pipes wherein each fresnel lens, compound parabolic concentrator and heat pipe are integrated as individual solar compound concentrators disposed with a plurality of additional solar compound concentrators;

wherein heat transfer fluid increases in temperature and pressure when passing said plurality of heat pipes, and said heat transfer fluid is delivered to a thermal engine to produce electric power.

2. The system according to claim 1, wherein said plurality of compound parabolic concentrator are made of glass mirror.

3. The system according to claim 1, wherein said plurality of compound parabolic concentrators are made of ceramic.

4. The system according to claim 1, wherein said plurality of compound parabolic concentrators comprise a reflective coating surface and protective coatings.

5. The system according to claim 4, wherein said reflective coating surface is aluminum.

6. The system according to claim 4, wherein said reflective coating surface is chrome plated on metal plates.

7. The system according to claim 1, wherein said plurality of heat pipe heat exchangers comprise a cermet coating.

8. A solar compound concentrator in a solar thermal electric power generation system for residential homes comprising:
- a fresnel lens for focusing sun rays such that the rays are concentrated five to ten times their normal intensity;
- a compound parabolic concentrator having a bottom side and being disposed under said fresnel lens for further concentration of said focused sun rays twenty to fifty times; and
- a honeycomb mesh-wired cross flow solar receiver for heating heat transfer fluid therein, wherein said honeycomb mesh-wired cross flow solar receiver is disposed on said bottom side of said compound parabolic concentrator;
- wherein said fresnel lens, said compound parabolic concentrator and said honeycomb mesh-wired cross flow solar receiver are integrated as the solar compound concentrator, wherein said heat transfer fluid increases in temperature and pressure when passing a plurality of said honeycomb mesh-wired cross flow solar receivers, and said heat transfer fluid is delivered to a thermal engine to produce electric power.

9. The system according to claim 8, wherein said compound parabolic concentrator is made of glass mirror.

10. The system according to claim 8, wherein said compound parabolic concentrator is made of ceramic.

11. The system according to claim 8, wherein said compound parabolic concentrator comprises a reflective coating surface and protective coatings.

12. The system according to claim 11, wherein said reflective coating surface is aluminum.

13. The system according to claim 11, wherein said reflective coating surface is chrome plated on metal plates.

14. A solar thermal electric power generation system for residential homes comprising:
- a plurality of fresnel lenses for focusing sun rays such that the rays are concentrated five to ten times their normal intensity;
- a plurality of compound parabolic concentrators having a bottom side and being disposed under said plurality of fresnel lenses for further concentration of said focused sun rays twenty to fifty times;
- a plurality of heat exchangers for heating heat transfer fluid therein, wherein said plurality of heat exchangers are disposed on said bottom side of said plurality of compound parabolic concentrators; and
- a housing that contains said plurality of fresnel lenses, compound parabolic concentrators, and heat exchangers, wherein each fresnel lens, compound parabolic concentrator and heat exchanger are integrated as individual solar compound concentrators and arranged in a pattern;
- wherein the diameter of each compound parabolic concentrator at the top of the aperture, is wider than the range of movement of the focal points of each fresnel lens, so that said solar compound concentrators are arranged in a flat plate panel to collect direct solar irradiation for a longer period of time without tracking the movement of the sun; and
- wherein said heat transfer fluid increases in temperature and pressure as it passes a plurality of said heat exchangers, and said heat transfer fluid is delivered to a thermal engine to produce electric power.

* * * * *